(12) United States Patent
Niki

(10) Patent No.: US 8,237,056 B2
(45) Date of Patent: Aug. 7, 2012

(54) PRINTED WIRING BOARD HAVING A STIFFENER

(75) Inventor: Ayao Niki, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 294 days.

(21) Appl. No.: 12/505,032

(22) Filed: Jul. 17, 2009

(65) Prior Publication Data

US 2010/0116529 A1  May 13, 2010

Related U.S. Application Data

(60) Provisional application No. 61/113,830, filed on Nov. 12, 2008.

(51) Int. Cl.
*H05K 1/03* (2006.01)

(52) U.S. Cl. .......................................... 174/255; 29/843

(58) Field of Classification Search ............ 174/255, 174/256–259, 262–266; 361/792–795; 29/842–845
See application file for complete search history.

(56) References Cited

U.S. PATENT DOCUMENTS

| | | | |
|---|---|---|---|
| 6,342,682 B1 | 1/2002 | Mori et al. | |
| 6,548,767 B1 | 4/2003 | Lee et al. | |
| 6,828,510 B1 | 12/2004 | Asai et al. | |
| 7,157,796 B2 | 1/2007 | Yamagata | |
| 8,085,546 B2 | 12/2011 | Niki | |
| 2003/0034566 A1* | 2/2003 | Jimarez et al. | 257/778 |
| 2003/0047807 A1* | 3/2003 | Alcoe et al. | 257/734 |
| 2003/0121700 A1 | 7/2003 | Schmidt | |
| 2004/0211751 A1 | 10/2004 | Shuto et al. | |
| 2005/0016768 A1 | 1/2005 | Zollo et al. | |
| 2005/0230711 A1 | 10/2005 | Chang et al. | |
| 2005/0231889 A1 | 10/2005 | Tsuji | |
| 2007/0263370 A1 | 11/2007 | Niki | |
| 2008/0149383 A1* | 6/2008 | Kaneko et al. | 174/262 |
| 2009/0078451 A1 | 3/2009 | Niki et al. | |
| 2009/0302439 A1* | 12/2009 | Pagaila et al. | 257/660 |
| 2010/0095523 A1 | 4/2010 | Niki | |
| 2011/0220399 A1 | 9/2011 | Niki | |

FOREIGN PATENT DOCUMENTS

| | | |
|---|---|---|
| JP | 2000-323613 | 11/2000 |
| JP | 2001-94252 | 4/2001 |
| JP | 2002-083893 | 3/2002 |
| JP | 2002-151853 | 5/2002 |
| JP | 2002-359446 | 12/2002 |
| JP | 2004-265967 | 9/2004 |
| JP | 2005-244140 | 9/2005 |

\* cited by examiner

*Primary Examiner* — Jeremy Norris
(74) *Attorney, Agent, or Firm* — Oblon, Spivak, McClelland, Maier & Neustadt, L.L.P.

(57) ABSTRACT

To provide a novel multilayer printed wiring board in which a conductor on the outermost resin layer is positioned properly. Furthermore, to provide a novel multilayer printed wiring board in which productivity is enhanced when forming solder bumps on the pads for mounting a semiconductor element. In multilayer printed wiring board, multiple pads for connection with a semiconductor chip are formed on one surface, and on its opposite surface, external connection terminals for connection with another substrate are formed. The pads for connection with a semiconductor chip are formed in the central region of one surface, stiffener is formed in the peripheral region surrounding the pads for connection with a semiconductor chip, pads for connection with a semiconductor chip and stiffener are formed with the same material and are set to be the same height, and the actual area of the stiffener is determined according to the total area of the multiple pads for connection with a semiconductor chip.

20 Claims, 11 Drawing Sheets

PRINTED WIRING BOARD HAVING A STIFFENER

CROSS-REFERENCE TO RELATED APPLICATIONS

The present application claims the benefits of priority to U.S. Application No. 61/113,830, filed Nov. 12, 2008. The contents of that application are incorporated herein by reference in their entirety.

BACKGROUND OF THE INVENTION

1. Technical Field

The present invention is related to a multilayer printed wiring board. More specifically, it is related to a multilayer printed wiring board characterized by a surface for mounting electronic components such as a semiconductor chip.

2. Description of Related Art

Recently, printed wiring boards are becoming thinner and lighter. If a printed wiring board is made thinner, its mechanical strength will decrease. Thus, a reinforcing plate is mounted on such a printed wiring board. Regarding such technology, for example, Japanese Laid-Open Patent Publication 2002-83893 listed below (hereafter "Patent Publication (1)") is disclosed. This publication discloses a step to form a printed wiring board on a metal plate, and a step to leave the metal plate (reinforcing plate) on the printed wiring board in a framed configuration. Then, in Patent Publication (1), an IC chip is mounted on the pads formed on the printed wiring board.

Patent Publication (1): Japanese Laid-Open Patent Publication 2002-83893 "SEMICONDUCTOR PACKAGE SUBSTRATE, SEMICONDUCTOR DEVICE AND THEIR MANUFACTURING METHODS" (date of publication: Mar. 22, 2002).

The contents of this publication are incorporated herein by reference in their entirety.

BRIEF SUMMARY OF EMBODIMENTS OF THE INVENTION

Disclosure of the Invention

According to an example of the Patent Publication (1), the thickness of the metal plate is in the range of 0.1-1.5 mm. By contrast, the thickness of the pads is thought to be a few dozen millimicrons. Thus, in Patent Publication (1), the amount of metal in the area to mount an IC chip is substantially different from that in the area where the metal plate is formed. Therefore, a printed wiring board according to Patent Publication (1) may warp or undulate, especially when soldering reflow is conducted on the printed wiring board. Accordingly, it is thought that mounting an IC chip on the printed wiring board will become more difficult.

Accordingly, one objective of the present invention is to provide a novel multilayer printed wiring board in which a conductor on the outermost resin insulation layer is positioned properly.

Another objective of the present invention is to provide a novel multilayer printed wiring board in which productivity is enhanced when forming solder bumps on the pads for mounting a semiconductor element.

Considering the above objectives, an embodiment of a multilayer printed wiring board according to the present invention includes multiple resin insulation layers having an outermost resin insulation layer; multiple pads for mounting an electronic component formed in a pad-forming region on the outermost resin insulation layer; a stiffener with an opening formed on the outermost resin insulation layer; an inner-layer resin insulation layer formed underneath the outermost resin insulation layer; an inner-layer conductive circuit formed on the inner-layer resin insulation layer; and a via conductor formed in the outermost resin insulation layer and connecting one of the plurality of pads and the inner-layer conductive circuit.

In such a printed wiring board, multiple pads are formed inside the opening of the stiffener, and the upper surface of the stiffener and the upper surfaces of the pads are positioned at substantially the same level.

In addition, the stiffener of the above multilayer printed wiring board may have multiple cut-out sections.

Furthermore, in the above multilayer printed wiring board, the entire upper-surface area of the stiffener may be substantially the same as the total area obtained by adding together the upper surface of each pad.

Furthermore, in the above multilayer printed wiring board, the stiffener may be used as a power-source layer or a ground layer.

Moreover, a method for manufacturing a printed wiring board according to the present invention includes adhering or bonding a metal foil to a support plate the surface of which is made of a metal; forming a resin insulation layer on the metal foil; forming an opening portion for a via conductor in the resin insulation layer; forming a conductive circuit on the resin insulation layer; forming a via conductor in the opening portion which connects the metal foil and the conductive circuit; making a separating between the support plate and the metal foil; and forming multiple pads for mounting a semiconductor chip in the central region and a stiffener surrounding the multiple pads from the metal foil.

According to embodiments of the present invention, a novel multilayer printed wiring board may be provided in which the conductor on the outermost resin insulation layer is positioned properly.

Furthermore, according to embodiments of the present invention, a novel multilayer printed wiring board may be provided in which productivity is enhanced when forming solder bumps on pads for mounting a semiconductor element.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. (1A) is a view showing a multilayer printed wiring board of a First Embodiment of the present invention;

Figure 1A:
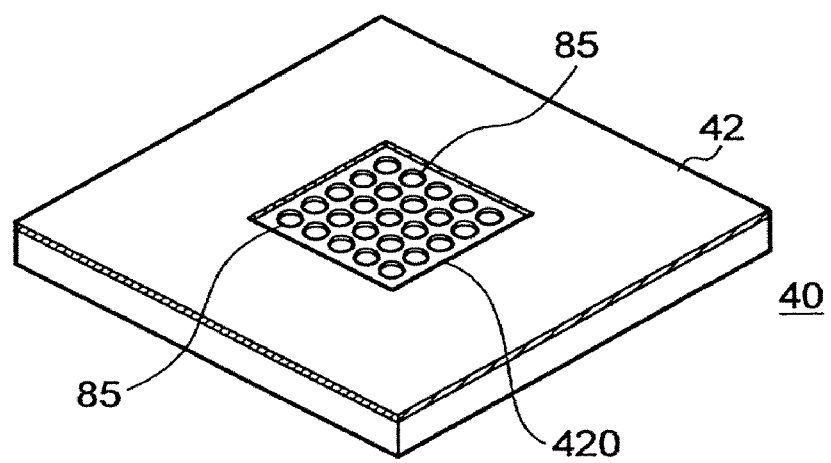

FIG. (1B) is a view showing a multilayer printed wiring board of a Second Embodiment of the present invention;

FIG. (1C) is a view showing an electronic-component mounting surface of the multilayer printed wiring board shown in FIG. (1A);

FIG. (1D) is a view showing an electronic component (such as a semiconductor chip) mounted on the multilayer printed wiring board shown in FIG. (1A);

FIG. (1E) is a view showing the opposite surface of the multilayer printed wiring board shown in FIGS. (1A)-(1D);

FIG. (1F) is a cross-sectional view of the multilayer printed wiring board seen from the direction of (I-I) in FIG. (1D);

FIGS. (2A)-(2P) are views showing the steps of manufacturing a printed wiring board shown in FIG. (1A);

FIGS. (3A)-(3B) are views to illustrate a method for manufacturing a multilayer printed wiring board using a single-sided copper-clad laminate as a support plate according to an embodiment of the invention;

FIG. (4) is a view to illustrate a multilayer printed wiring board according to a Third Embodiment of the invention;

FIG. (5A) is a view to illustrate an ultrasonic bonding process to be conducted in a method for manufacturing a multilayer printed wiring board according to an embodiment of the invention;

FIG. (5B) is a view showing a situation in which a copper foil of the support plate and another copper foil laminated thereon are bonded at the bonded portions along the edges of the support plate as a result of the ultrasonic bonding process; and FIG. (6) is a view showing a situation in the manufacturing step of FIG. (2E) where an etching resist is formed in such a way that its edges overlap the ultrasonic bonded portions.

DETAILED DESCRIPTION OF THE EMBODIMENTS

The embodiments will now be described with reference to the accompanying drawings, wherein like reference numerals may designate corresponding or identical elements throughout the various drawings. Further, where the same numerical reference is applied to the same element, its redundant description is omitted.

First Embodiment

The First Embodiment is related to multilayer printed wiring board (40) characterized by a surface for mounting an electronic component (such as a semiconductor chip).

FIG. (1A) is a view showing multilayer printed wiring board (40) of the First Embodiment. FIG. (1B) is a view showing multilayer printed wiring board (40a), which will be later described in the Second Embodiment. FIG. (1C) is a view showing the surface for mounting an electronic component in multilayer printed wiring board (40) shown in FIG. (1A). FIG. (1D) is a view in which electronic component (41) (such as a semiconductor chip) is mounted on multilayer printed wiring board (40) shown in FIG. (1A). FIG. (1E) is a view showing the opposite surface of multilayer printed wiring boards (40, 40a). FIG. (1F) is a cross-sectional view of multilayer printed wiring board (40) seen from the direction (I-I) in FIG. (1D).

As shown in FIG. (1A), on the semiconductor-chip mounting surface of multilayer printed wiring board (40), stiffener (42) (also referred to as "reinforcing plate" or "reinforcing member") having opening (420) (also referred to as "first opening") and multiple pads (85) for mounting electronic components such as an IC chip are formed.

As shown in FIG. (1C), pads (85) are formed in pad-forming region (46) in opening (420) of stiffener (42). Pad-forming region (46) is a rectangular region, the area of which is preferably set to be the smallest possible area to include all pads. In multilayer printed wiring board (40) of the First Embodiment, pads (85) are formed in pad-forming region (46) positioned in the central region of the outermost resin insulation layer. Stiffener (42) is formed in the peripheral region surrounding the pad-forming region. Pads (85) formed on the surface for mounting a semiconductor chip are conductors, for example, to be used for C4 mounting (Controlled Collapse Chip Connection). Solder bumps (86) are formed on pads (85), and semiconductor chip (41) will be mounted on the printed wiring board by means of the solder bumps (see FIG. (1F)). The position to form opening (420) of stiffener (42) is not limited to the central portion of stiffener (42). The opening may be formed in any position depending on the configuration of an electronic component. In addition, the configuration of opening (420) of stiffener (42) is shown as rectangular in the drawings, but its configuration is not limited to such. For example, other configurations such as a circle may be employed so as to correspond to pad-forming region (46).

Stiffener (42) is made of metal, most typically made of copper. Furthermore, stiffener (42) is preferred to be made of copper foil. More preferably, pads (85) and stiffener (42) are made of the same copper foil. Pads (85) and stiffener (42) may be formed by simultaneously patterning the same copper foil. Therefore, the upper surfaces of pads (85) and the upper surface of stiffener (42) may tend to be the same height measured from the surface of the outermost resin insulation layer.

As shown in FIG. (1D), electronic component (41) (such as a semiconductor chip) is mounted by means of solder bumps (86) on pads (85) in pad-forming region (46).

As shown in FIG. (1E), on the opposite surface, multiple external terminals (84) (see FIG. (1F)) are formed. Solder bump (44) is formed on each external terminal (84). External terminals (84) are, for example, BGA (Ball Grid Array) pads, and will be connected to the pads (not shown in the drawing) of other substrate (45) such as a motherboard by means of solder bumps (44). However, instead of solder bumps (44), pins (not shown in the drawings) may be formed on external terminals (84), which are then connected to motherboard (45) or the like by means of such pins.

As shown in FIG. (1F), in multilayer printed wiring board (40) of the First Embodiment, the upper surfaces of pads (85) and the upper surface of stiffener (42) are positioned at the same level.

Second Embodiment

FIG. (1B) is a view showing multilayer printed wiring board (40a) according to the Second Embodiment. In multilayer printed wiring board (40a), cut-out sections (43) (also referred to as "second openings") are formed in portions of stiffener (42). Because of such cut-out sections, multilayer printed wiring board (40a) is different from multilayer printed wiring board (40) of the First Embodiment shown in FIG. (1A). By forming cut-out sections (43) in stiffener (42), the actual area of stiffener (42) becomes smaller than the area of the stiffener in multilayer printed wiring board (40) according to the First Embodiment.

The configuration and number of cut-out sections (43) of stiffener (42) are not limited to anything specific. However, cut-out sections (43) of stiffener (42) are preferred not to be distributed unevenly at any specific positions, because warping or twisting may tend to occur in multilayer printed wiring board (40a). Specifically, cut-out sections (43) of stiffener (42) are preferred to be formed in substantially the same configuration on both sides of opening (420) at the surface for mounting an electronic component. In other words, cut-out sections (43) of stiffener (42) are preferred to be symmetrical to a surface which crosses the center of the outermost resin insulation layer and which is perpendicular to the surface of the outermost resin insulation layer. Alternatively, for example, a relatively large number of relatively small circles, rectangles or the like may be formed as cut-out sections (43) and arranged substantially evenly throughout stiffener (42). In doing so, the mechanical strength of multilayer printed wiring board (40a) may be distributed substantially evenly.

It is preferred that the actual area of stiffener (42) (the upper-surface area of the stiffener) be determined according to the combined area of all pads (85) (the total area obtained by adding together the upper surfaces of all pads). The entire upper-surface area of stiffener (42) is preferred to be substantially the same as the total area obtained by adding together the upper surface of each pad (85). It is preferred that the ratio of actual area (SS) of stiffener (42) to the total area (AP) of pads (85) satisfy the following formula: SS/AP=0.70-1.30. If the ratio is in such a range, warping or twisting of a multilayer printed wiring board may easily be suppressed.

A feature of multilayer printed wiring board (40a) of the Second Embodiment is that the actual area (SS) of stiffener (42) is determined according to the total area (AP) of all pads. Furthermore, multilayer printed wiring board (40a) of the Second Embodiment has the same features as in multilayer printed wiring board (40) of the First Embodiment.

Third Embodiment

Figure 1B:
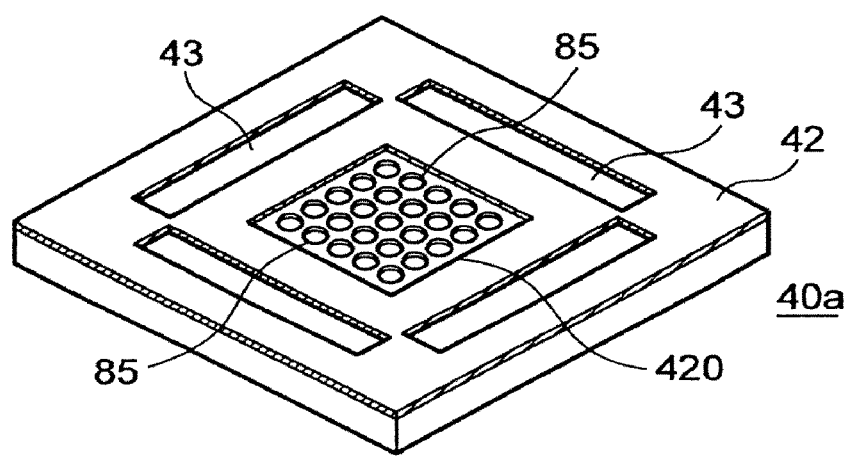
Figure 1C:
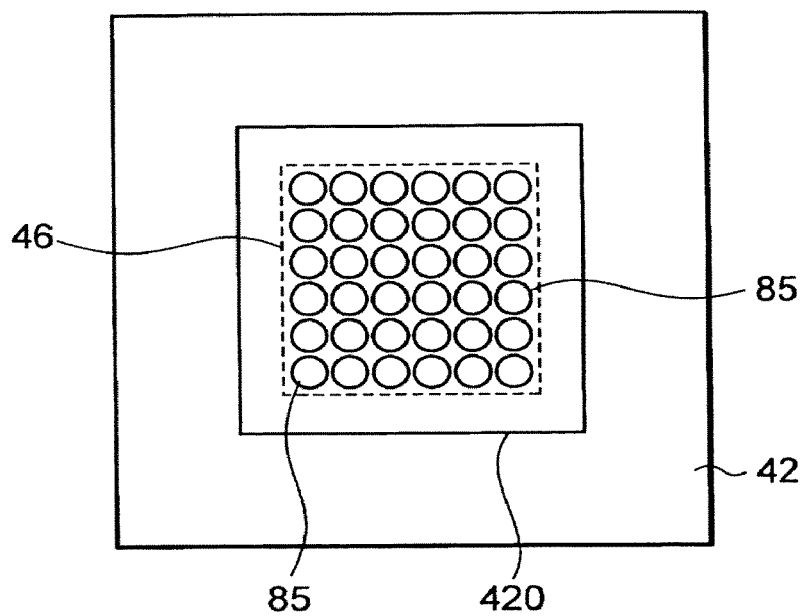
Figure 1D:
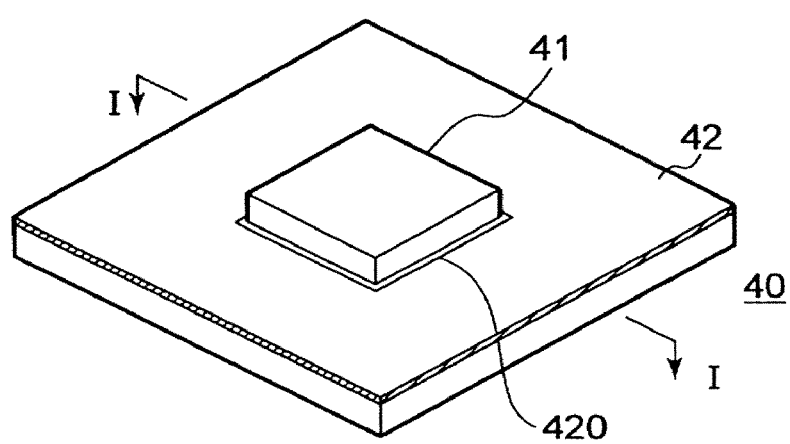
Figure 1E:
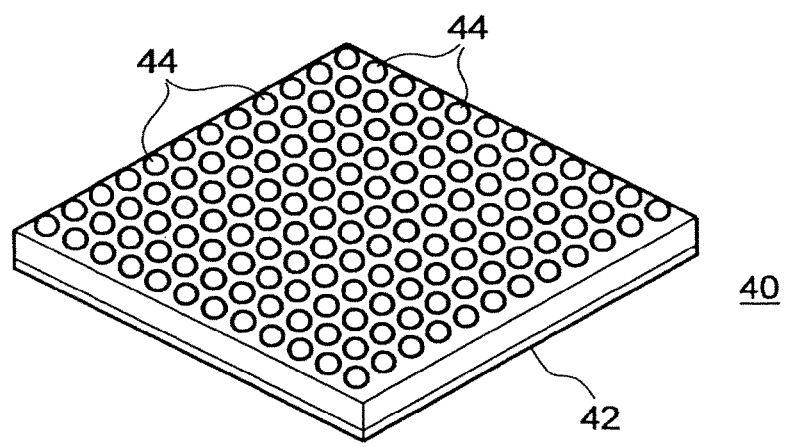
Figure 1F:
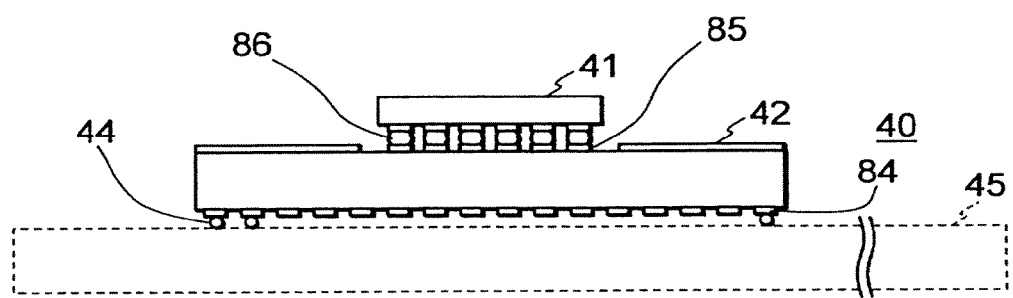
Figure 2A:
Figure 2B:
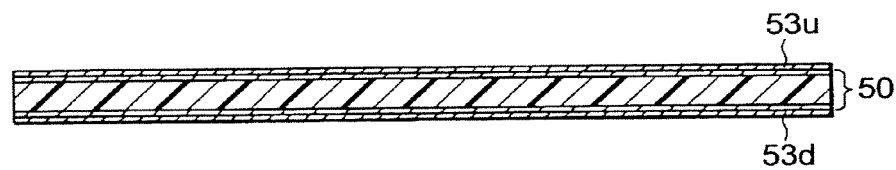
Figure 2C:
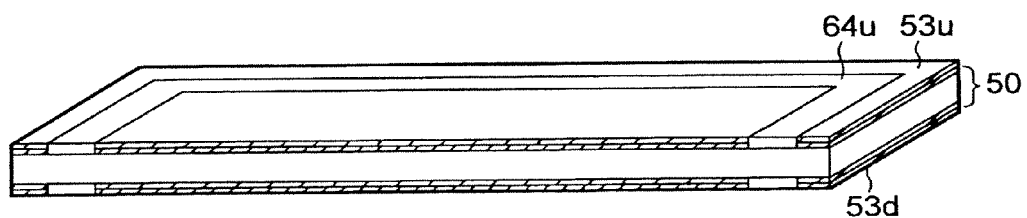
Figure 2D:
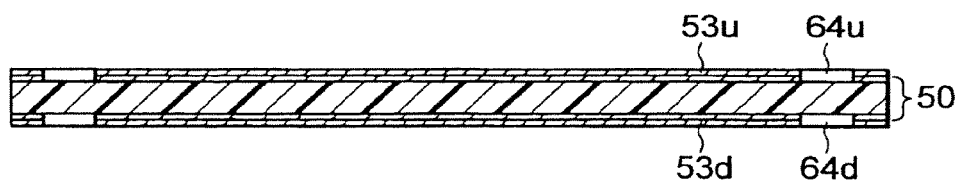
Figure 2E:
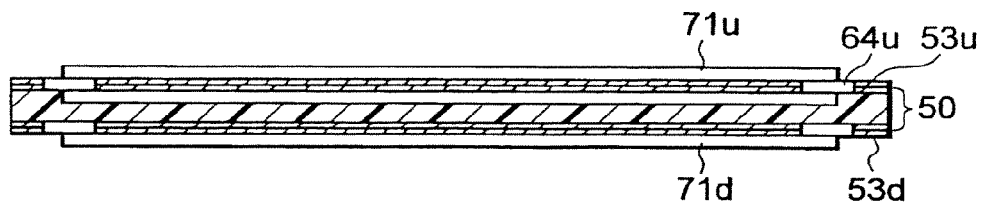
Figure 2F:
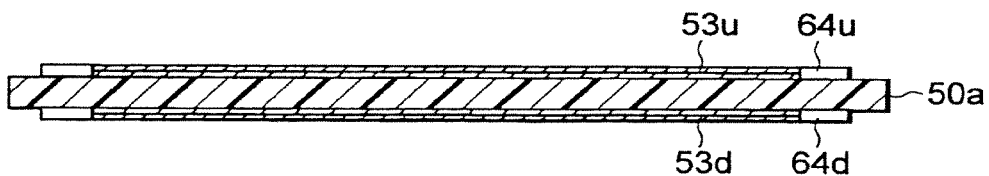
Figure 2G:
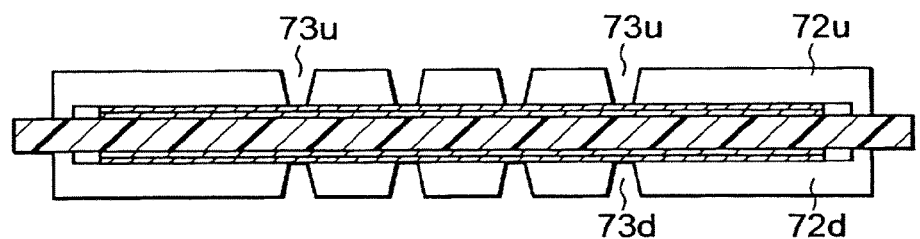
Figure 2H:
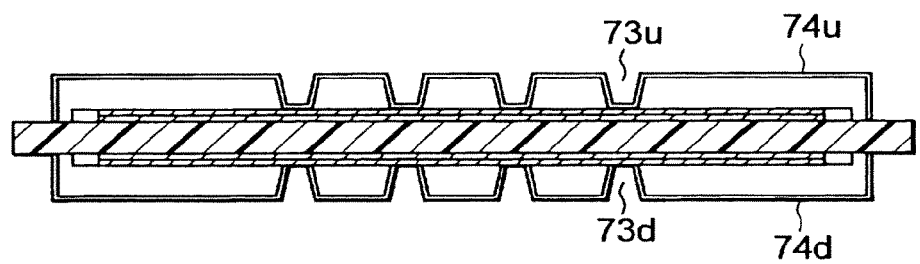
Figure 2I:
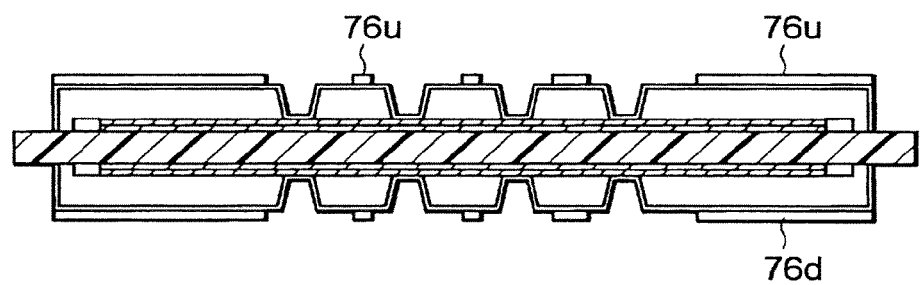
Figure 2J:
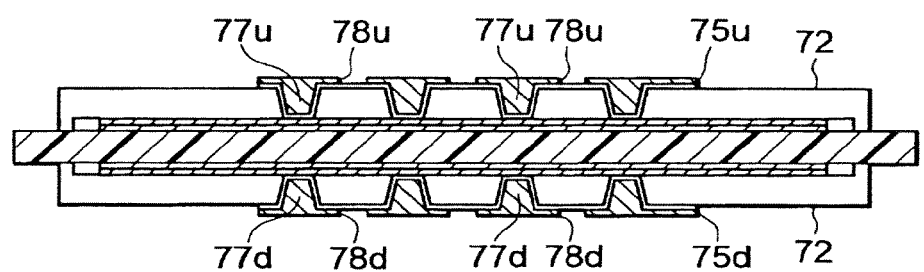
Figure 2K:
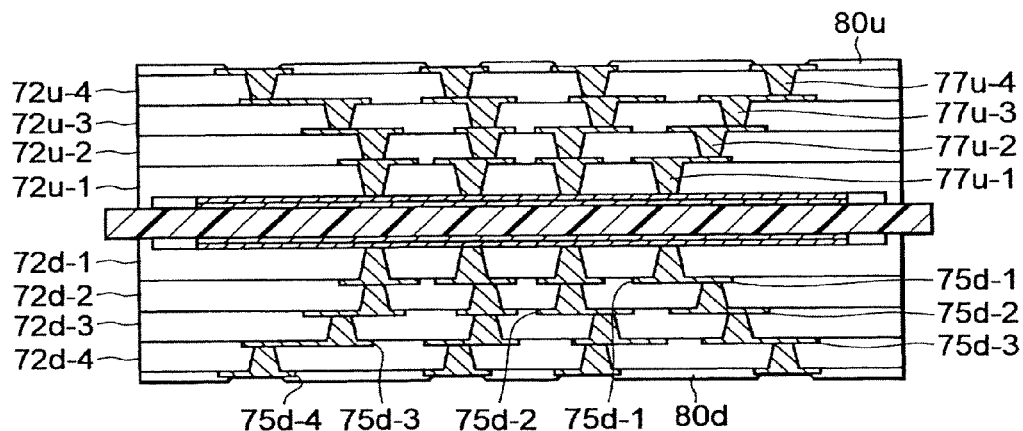
Figure 2L:
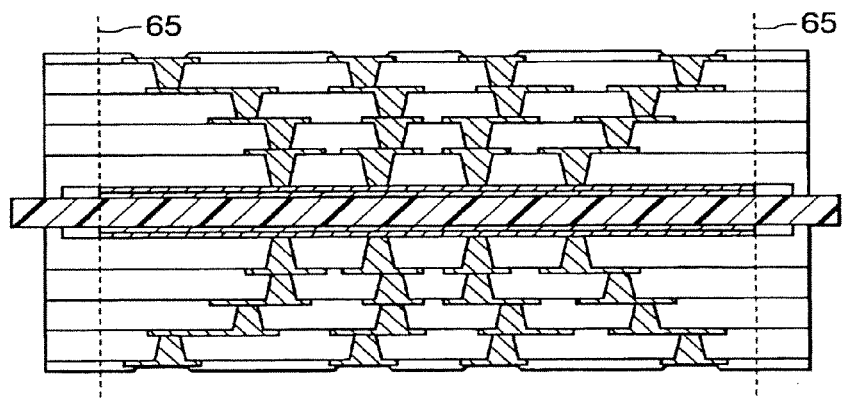
Figure 2M:
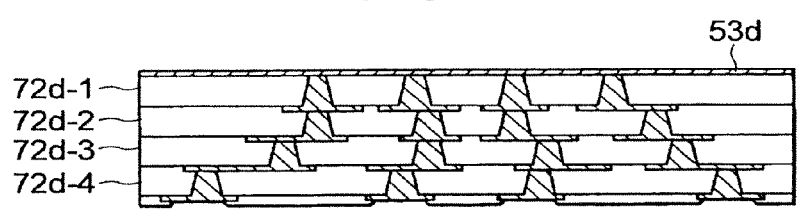
Figure 2N:
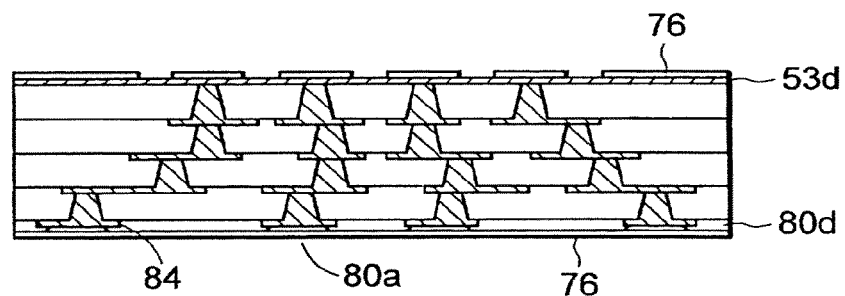
Figure 2O:
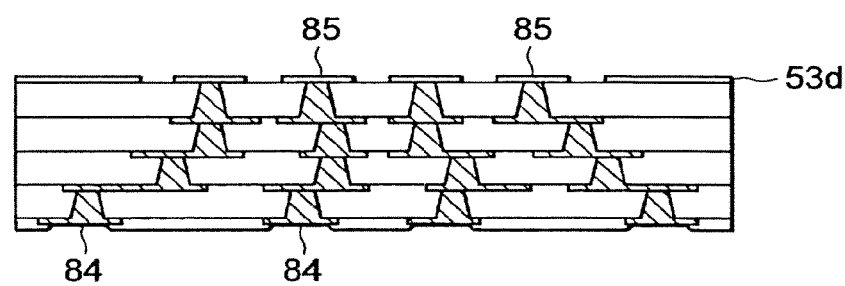
Figure 2P:
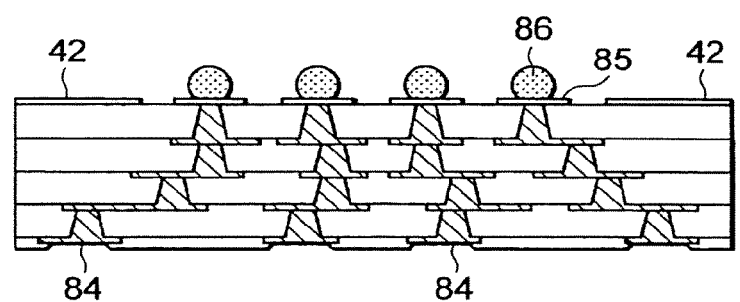
Figure 4:
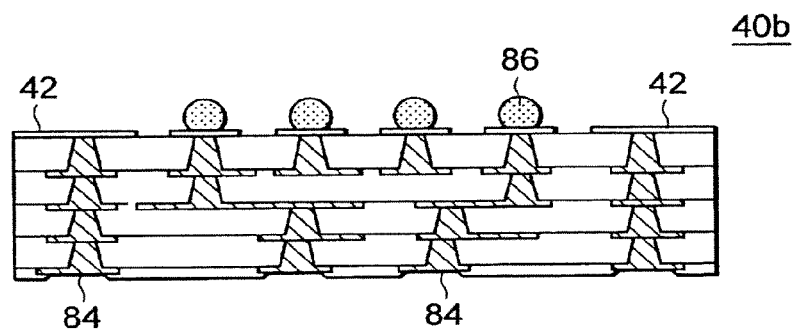
Figure 5A:
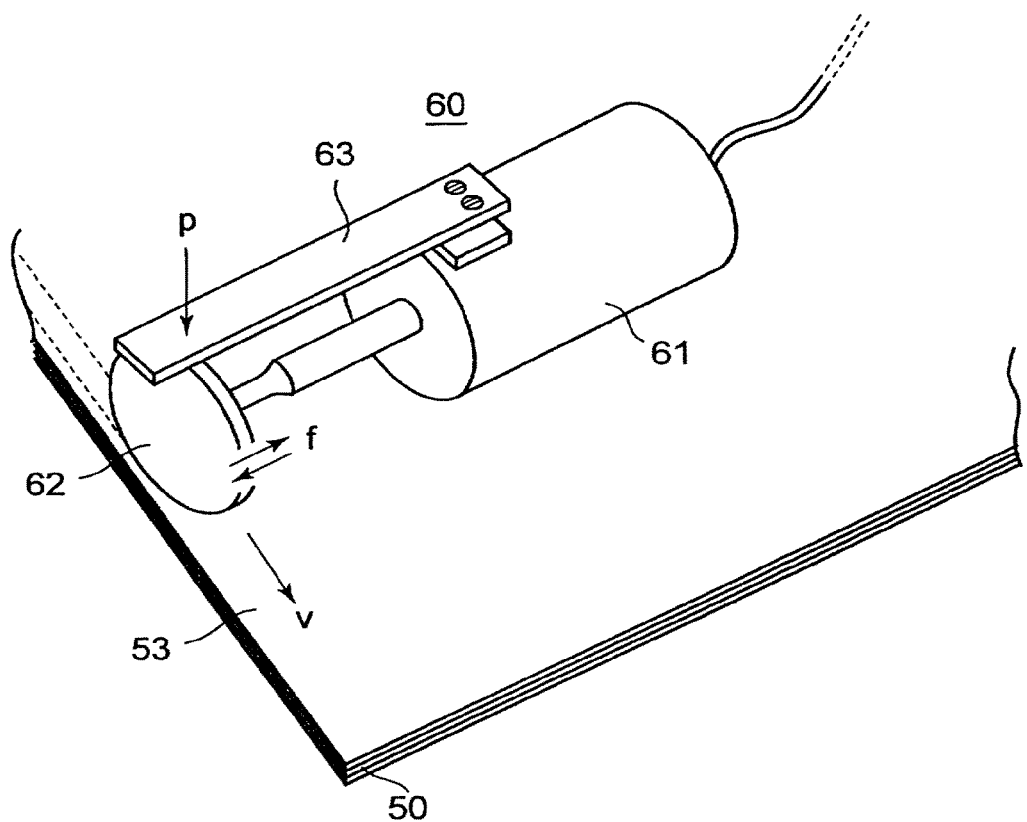
Figure 5B:
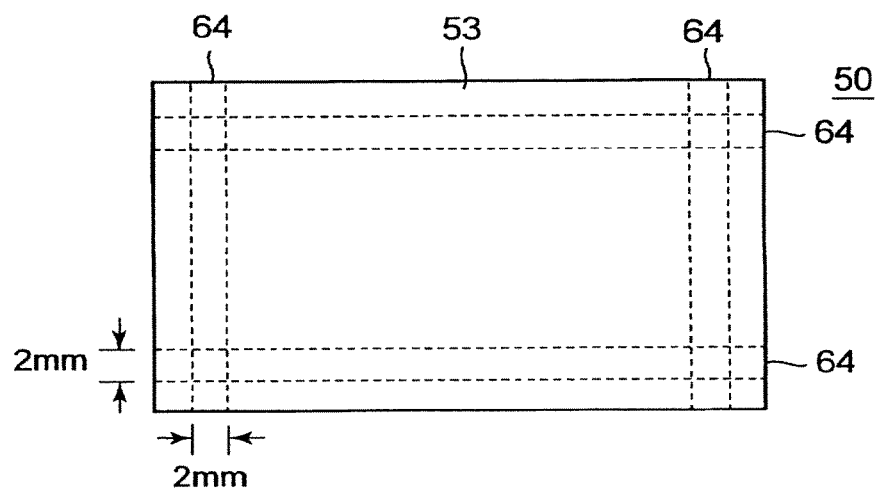

Although it is not shown in the drawings, in multilayer printed wiring board (40b) according to the Third Embodiment, stiffener (42) as in multilayer printed wiring boards (40, 40a) shown in FIGS. 1A, 1B) is used as a power-source layer or a ground layer. As shown in FIG. 4), in multilayer printed wiring board (40b) of the Third Embodiment, stiffener (42) is connected to a power-source layer or a ground layer through via conductors and/or conductive circuits. Relatively large stiffener (42) is arranged near pads (85), which include signal lines, so as to function as a power-source layer or a ground layer, and the electrical features of the printed wiring board will be stabilized or enhanced.

Fourth Embodiment

The Fourth Embodiment is related to methods for manufacturing multilayer printed wiring boards (40, 40a, 40b) according to the First through Third Embodiments. Since such methods for manufacturing those multilayer printed wiring boards are similar, a method for manufacturing multilayer printed wiring board (40) is described here.

FIGS. (2A)-(2P) are views showing the steps of the method for manufacturing multilayer printed wiring board (40) according to example embodiment. Since multilayer printed wiring board (40) is very thin, support plate (50) is used up to a certain step of the manufacturing process. Thus, support plate (50) and the metal foil on the plate which will become part of the printed wiring board are bonded using ultrasonic waves. Furthermore, to enhance productivity, multilayer printed wiring board (40) is formed respectively on both surfaces (on the upper and lower surfaces) of support plate (50) so that two units of the wiring boards will be manufactured simultaneously.

As shown in FIG. (2A), a copper-clad laminate is prepared as support plate (50). Copper-clad laminate (50) uses, for example, brand name "MCL-E679 FGR" made by Hitachi Chemical Co., Ltd. Copper-clad laminate (50) is formed by laminating 35 μm-thick copper foils (52u, 52d) on their respective surfaces of 0.4 mm-thick glass-epoxy laminate (51). Copper-clad laminate (50) functions as a support plate for a printed wiring board (40) up to the manufacturing step shown in FIG. (2L).

As for support plate (50), substrates may be used which are made by laminating metal foils such as copper foil on laminates, for example, glass-base laminate impregnated with bismaleimide-triazine resin, glass-base laminate impregnated with polyphenylene ether resin, glass-base laminate impregnated with polyimide or the like. Alternatively, a metal plate may be used.

As shown in FIG. (2B), copper foils (53u, 53d) with a thickness of 12-35 μm are laminated on their respective surfaces of the support plate. From copper foils (53u, 53d), pads (85) will be formed in the central region of the surface for mounting a semiconductor chip. Also, on the peripheral regions, stiffener (42) will be formed. Instead of laminating copper foils on copper-clad laminate, a copper foil with a carrier may be used as a starting material, which is already made by laminating copper foils on copper-clad laminate.

As shown in FIG. (2C), copper foils (52u, 52d) and copper foils (53u, 53d) on copper-clad laminate (10) are bonded respectively using ultrasonic waves. Bonded portions (64u, 64d) are positioned along the periphery of copper foils (53u, 53d). If copper foils with a carrier are used as a starting material, copper foils on both surfaces will not be removed from support plate (50), but will be bonded along the peripheries of the copper foils using ultrasonic waves.

The method for ultrasonic bonding is described with reference to FIG. (5A). Ultrasonic bonding apparatus (60) has transducer (61), horn (62) and pressing member (63). As shown in FIG. (5B), ultrasonic bonding is conducted by moving horn (62) along the edges (for example, 20 mm inside the edges) of support plate (50). Bonding conditions are: amplitude of horn (62) approximately 12 μm; number of oscillations (f) 28 kHz/sec.; pressure (p) against copper foil (53) approximately 0-12 kgf; and travel speed (v) (application time) along copper foil (53) approximately 10 mm/sec. However, the ultrasonic bonding apparatus and bonding conditions are not limited to such. As long as both copper foils (53u, 53d) are adhered to support plate (50) during the manufacturing process from the initial step (see FIG. (2A)) to the separation step of copper foils (see FIG. (2M)), other ultrasonic apparatuses and bonding conditions may be employed.

As shown in FIG. (5B), as a result of such ultrasonic bonding, copper foil (52) of support plate (50) and copper foil (53) laminated on copper foil (52) are bonded in bonded portions (64) along the edges of support plate (50). The width of the bonded portions is, for example, approximately 2 mm. Accordingly, support plate (50) and copper foil (53) are adhered (fixed), and their relative motions are prevented. If copper foil (53) is not fixed to copper foil (52) of support plate (50), that indicates printed wiring board (40) to be formed on copper foil (53) will not be fixed to support plate (50). Accordingly, during each manufacturing step, copper foil (53) may expand and contract along with interlayer resin insulation layers formed on them, causing copper foil (53) to be deformed. However, in the present method, since copper foil (53) is fixed to support plate (50), copper foil (53) may seldom move relative to support plate (50). Therefore, the risk that copper foil (53) is deformed will be minimized.

FIG. (2D) is a cross-sectional view showing the laminate after the bonding process. At the areas closer to the edges than bonded portions (64u, 64d), treatment solutions may seep between support plate (50) and copper foils (53) during each step. Such treatment solutions are difficult to wash off in the following cleaning treatment. Thus, the edges are processed as follows.

Figure 6:
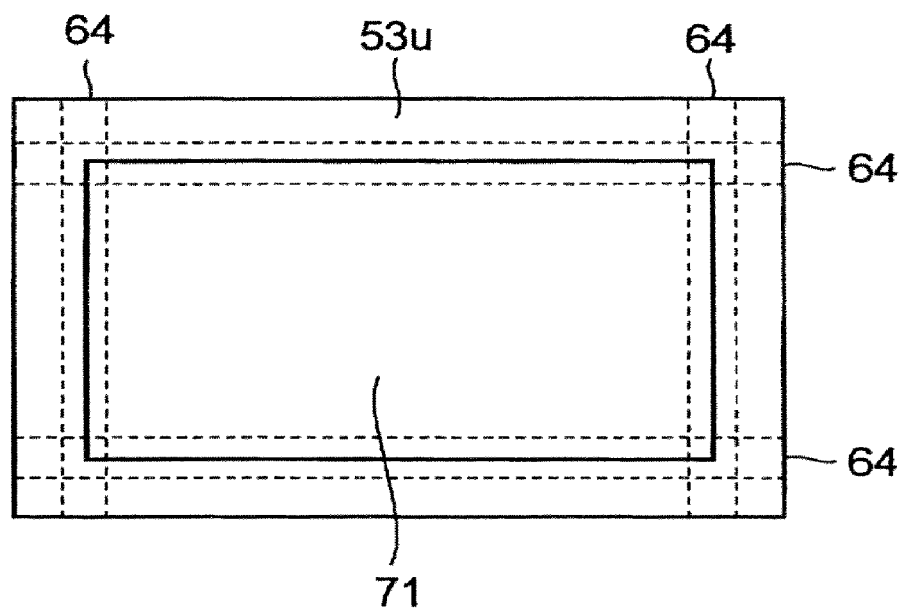

As shown in FIG. (2E), etching resists are formed on copper foils (53) so that the peripheral portions of etching resists (71u, 71d) will overlap ultrasonic bonded portions (64u, 64d). FIG. 6) is a plan view showing the laminate after the above step. It shows that the peripheral portion of etching resist (71) overlaps ultrasonic bonded portion (64).

As shown in FIG. (2F), the exposed portions of copper foils (53u, 53d) and copper foils (52u, 52d) of the copper-clad laminate are removed by etching. Then, etching resists (71u, 71d) are removed. As a result, copper foils (53u, 53d) and copper foils (52u, 52d) of support plate (50) are bonded in a frame configuration at bonded portions (64u, 64d). The entire peripheral portions of both copper foils are bonded. By such a treatment on the peripheral portions, treatment solutions may be prevented from seeping between copper foils (53u, 53d) and copper foils (52u, 52d) of support plate (50) in each of the later steps. Portions (50a) of the support plate protruding from the edges of copper foils (53u, 53d) may be cut off along the edges of the bonded portions of the copper foils.

After that, if required, the surfaces of metal foils (53u, 53d) may be roughened through a proper process (roughening treatment) such as a black oxide or etching treatment. To make roughened surfaces, for example, a CZ treatment may be used. As for the CZ treatment, for example, microetching solutions "CZ series" made by Mec Co., Ltd. may be used.

As shown in FIG. (2G), interlayer insulation film is laminated on copper foils (53), then the films are thermoset to form resin insulation layers (72u, 72d) respectively. For resin insulation layers, insulative resin containing inorganic particles and resin is preferred. Then, via-hole openings (73u, 73d) are formed using, for example, carbon-dioxide gas laser. As for the interlayer insulation film, for example, a brand name "ABF series" made by Ajinomoto Fine-Techno Co., Inc. may be used.

The forming of resin insulation layers is not limited to using interlayer insulation films. For example, such resin insulation layers may also be formed by placing semi-cured resin sheets such as prepreg on the copper foils and then thermopressing them. Especially, if the number of insulation layers is small when a substrate is completed (for example, three layers or fewer), and if it is a coreless substrate in which all insulation layers are formed with interlayer insulation films, the substrate strength may tend to decrease. Therefore, at least one of the interlayer resin layers is preferred to be a resin insulation layer having core material. By using a resin insulation layer with core material, the substrate strength may increase. For core material, fibers are preferred. As for a specific example of core materials, glass cloth, glass non-woven fabric, aramid non-woven fabric or the like may be listed. Resin insulation layers with core material are those made by impregnating core material with resin such as epoxy, and curing it. Therefore, if the number of resin insulation layers (72) of a multilayer printed wiring board is between one and three layers, at least one resin insulation layer is preferred to be made with resin and core material, and the rest of the resin insulation layers, other than such a resin insulation layer with resin and core material, are preferred to be made with resin and inorganic particles.

In addition, forming via holes is not limited to using a carbon-dioxide gas (CO2) laser. Instead, for example, excimer laser, YAG laser, UV laser or the like may be used.

As shown in FIG. (2H), the surfaces of resin insulation layers (72u, 72d) are roughened using, for example, permanganic acid. After that, on the inner walls of via-hole openings and on the surfaces of the resin insulation layers, electroless plating (such as electroless copper plating) is performed to deposit plating approximately a few millimicrons thick (74u, 74d). Before performing electroless copper plating, catalyst nuclei may be formed.

As shown in FIG. (2I), plating resists (76u, 76d) are formed in areas other than via conductors, conductive circuits and so forth.

As shown in FIG. (2J), using electroless plated films (74u, 74d) (such as electroless copper-plated films) as electrodes, electrolytic plating (such as electrolytic copper plating) is performed in the opening portions of plating resists (76u, 76d) to deposit plating approximately a few dozen millimicrons thick. After that, plating resists are removed. Furthermore, electroless plated films (74u, 74d) that were underneath the removed plating resists are etched away. Since those electroless plated films are very thin, they may be removed by quick etching. The entire conductive layer may be formed by electroless plating (such as electroless copper plating). At this step, a layer is formed with via conductor (77u) or (77d), land (78u) or (78d), conductive circuit (75u) or (75d) and so forth respectively. Via conductors, lands and conductive circuits are formed with electroless plated film and electrolytic plated film on the electroless plated film.

When a resin insulation layer with core material is used to form resin insulation layers, a B-stage resin layer such as prepreg and copper foil are laminated on copper foils (53) or on the lower-layer resin insulation layers. Then, by thermopressing them, resin insulation layers with core material are formed. Resin insulation layers with core material are coated with copper foil. In the following, via-conductor openings are formed in the resin insulation layers with core material using a direct or a conformal method. After that, in via-conductor openings and on the copper foils, electroless plated film and electrolytic plated film are formed. Then, using a subtractive method, conductive circuits are formed on the resin insulation layers with core material, and via conductors are also formed at the same time.

The steps shown from FIG. (2G) to FIG. (2J) are conducted once, and resin insulation layer (72) and conductive circuit (75) are formed to make one layer. Then, in each interlayer resin insulation layer (72), via conductors (77) for interlayer connection are formed. The surfaces of conductive circuits (75), lands (78) and via conductors (77) are preferred to be roughened. In multilayer printed wiring board (40), the steps shown from FIG. (2G) to FIG. (2J) are repeated for the required number of layers. By such steps, conductive layers having conductive circuits (75) and pads (78), and interlayer resin insulation layers (72) are alternately laminated. If the number of resin insulation layers (72) is four layers or more in a multilayer printed wiring board, each resin insulation layer is preferred to be made with resin and inorganic particles without containing core material.

In multilayer printed wiring board (40) according to the Third Embodiment, via conductors (77u, 77d) are formed to be connected to the portions of copper foils (53u, 53d), which will later become stiffener (42). Furthermore, those via conductors are electrically connected to a power-source layer or ground layer by way of other via conductors and/or conductive circuits.

In the example shown in FIG. (2K), the total number of interlayer resin insulation layers (72) of multilayer printed wiring board (40) is four, and the steps shown from FIG. (2G) to FIG. (2J) are conducted a total of four times.

As shown in FIG. (2K), on the outermost resin insulation layers and the outermost conductive layers, SR (solder resists) (80u, 80d) are formed respectively. When forming solder resists (80), for example, the surfaces of the outermost conductive layers are roughened, the solder resists are laminated and patterned, and then opening portions (80a) are formed on the conductive circuits. To roughen the surfaces of the outermost conductive circuits, for example, CZ treatment described with reference to FIG. (1G) may be used. The conductive portions exposed through opening portions (80a) become external terminals (84) (see FIG. (1F)). In the later step shown in FIG. (2P), solder bumps (44) or pins (not shown in the drawings) are formed on the external terminals. Printed wiring board (40) will be electrically connected to another substrate (45) such as a motherboard by means of solder bumps (44) or pins formed on external terminals (84).

As shown in FIG. (2L), the entire substrate is separated along the cutting lines (65), which are inside the ultrasonic bonded portions (64u, 64d). After being cut, the printed wiring board formed on top of support plate (50) is separated between copper foil (53u) and copper foil (52u) of support plate (50); and the printed wiring board formed beneath the support plate is separated between copper foil (53d) and copper foil (52d) of support plate (50).

By the steps shown from FIG. (2A) to FIG. (2L), two units of printed wiring board (40) may be simultaneously manufactured on the upper side and lower side of support plate (50). Multilayer printed wiring board (40) formed beneath support plate (50) is shown in FIG. (2M). In the following, the manufacturing steps of a multilayer printed wiring board formed beneath a support plate are described. The manufacturing steps of a multilayer printed wiring board formed on the upper side are the same.

In the following, as shown in FIG. (2N), to form a surface for mounting an electronic component such as a semiconductor chip, stiffener (42) and pads (85) are formed from copper foil (53d) respectively. In multilayer printed wiring board (40) according to the First Embodiment, opening (420) (first opening) of stiffener (42) is also formed simultaneously. In multilayer printed wiring board (40a) according to the Second Embodiment, opening (420) as well as cut-out sections (43) (second openings) of stiffener (42) are also formed simultaneously.

Namely, a dry film is laminated on copper foil (53d) and patterned to form etching resist (76). At that time, to protect external terminals (84) exposed through opening portions (80a) of lower SR layer (80d) from the etchant, an etching-resist dry film is formed on the entire SR layer and the opening portions. After that, portions of copper foil (53d) exposed through etching resist (76) are removed by etching. Then, etching resists (76) are removed.

As shown in FIG. (2O), after the etching resists are removed, a surface treatment is conducted on pads (85) on the semiconductor-chip loading surface and external terminals (84) (for example, BGA pads) on the opposite side. Such a surface treatment is conducted, for example, to prevent rust on copper pads and to maintain solderability. For example, an OSP treatment (water-soluble preflux treatment: organic solderability preservative) may be used. Alternatively, electroless Ni-plated film is formed on the pad surfaces, and then Au-plated film is formed on the electroless Ni-plated film; or electroless Pd-plated film may be arranged between the electroless Ni-plated film and electroless Au-plated film.

As shown in FIG. (2P), solder bumps (86) are formed on pads (85) of the semiconductor-chip loading surface. To form solder bumps, for example, solder paste is screen printed. Since stiffener (42) and pads (85) are formed from copper foil (53d) and are positioned on the same level, forming solder bumps is conducted efficiently. Electronic component (41) such as an IC chip is loaded by means of solder bumps (86) formed on pads (85). Solder bumps (44) or pins (not shown in the drawing) may also be formed on external terminals (84) on the opposite side.

Although not shown in the drawings, after the above, multilayer printed boards are separated to make them individual units. To separate individual units, for example, dicing is employed. In the following, an OS check (open/short check) is conducted. Through an OS check, if an electrically defective unit is found, it will be selectively removed. Furthermore, an FVI (final view inspection) is conducted. By an FVI, if a unit's external appearance is found defective, it will be selectively removed.

Through the above steps, multilayer printed wiring board (40) shown in FIG. (1A) is manufactured.

Fifth Embodiment

In steps shown from FIG. (2A) to FIG. (2P), a method was described for manufacturing printed wiring boards (40) on both surfaces of support plate (50) from a productivity viewpoint. However, the present invention is not limited to such. Printed wiring board (40) may be manufactured only on one side of support plate (50).

Figure 3A:
Figure 3B:
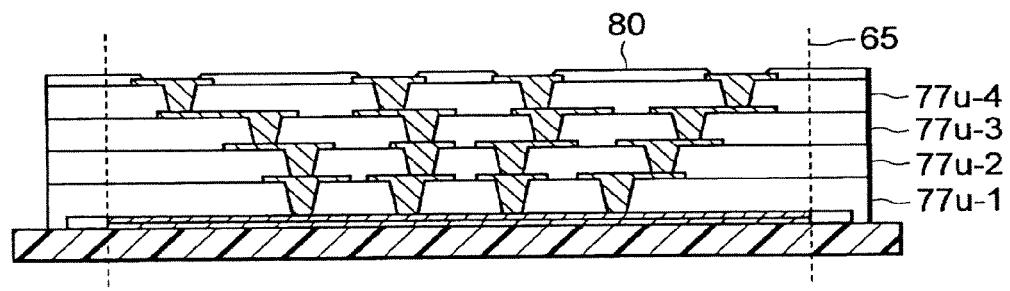

In such a case, instead of the step shown in FIG. (2A), a single-sided copper-clad laminate is prepared as support plate (50) as shown in FIG. 3A), and then copper foil (53) is laminated. After that, following the same steps shown from FIG. (2B) to FIG. (2L), one unit of printed wiring board is completed as shown in FIG. (3B). The rest of the steps are the same as those shown from FIG. (2M) to FIG. (2P).

Advantages & Features of Example Embodiments

In multilayer printed wiring boards (40, 40a, 40b) of the example embodiments, the upper surfaces of pads (85) and the upper surface of stiffener (85), which are formed on the outermost resin insulation layer, are positioned at the same level as shown in FIG. (1F). Since stiffener (42) has the same height as those of pads (85), the stiffener will not hamper the formation of solder bumps (86) on pads (85). Thus, using ball loading or screen printing, solder bump (86) may surely be formed on each pad (85). Productivity is high, since screen printing, for example, may be used to form solder bumps (86). Since solder bumps are formed on a printed wiring board with stiffener (42), the height of a solder bump on each pad may easily be made substantially the same.

In multilayer printed wiring boards (40, 40a, 40b) of the present embodiments, the upper surfaces of pads (85) are positioned at the same level. In the present embodiments, the thicknesses of the stiffener and the pads are substantially the same. Thus, the upper surfaces of all pads may tend to be set at the same level. Accordingly, an electronic component such as an IC chip may be easily mounted on the pads. As a result, the connection reliability between the electronic component and the printed wiring board will be enhanced. Also, the number of solder bumps (86) to be formed on pads (85) may be reduced. Thus, the electronic component and the printed wiring board may be connected with low resistance.

The height of pads (85) (the thickness of the pads themselves) formed in pad-forming region (46) is substantially the same as the height of stiffener (42) (the thickness of the stiffener itself) formed in the surrounding region of the pad-forming region. Thus, the mechanical strength of the pad-forming region and its surrounding regions at the outermost layer may tend to become the same. Moreover, in multilayer printed wiring boards (40, 40a, 40b) of the present embodiments, materials for pads (85) and stiffener (42) may be made the same. As for the material of pads (85) and stiffener (42), copper is preferred. Accordingly, the mechanical strength of the printed wiring board in pad-forming region (46) and its surrounding regions will tend to become even more uniform.

In printed wiring board (40a) of the Second Embodiment, cut-out sections (43) (second openings) are formed in portions of stiffener (42). According to the total area obtained by adding together all pads (85), the number and area of cut-out sections (43) may be adjusted, and the actual area of stiffener (42) may be determined. The entire upper-surface area of stiffener (42) is preferred to be substantially the same as the total area obtained by adding together the upper surface of each pad (85). For example, the ratio of the actual area (SS) of stiffener (42) and the total area (AP) of pads (85) may be set as SS/AT=0.70–1.30. As a result, the mechanical strength in pad-forming region (46) and its surrounding regions at the outermost layer may be made even more uniform. Thus, warping or twisting of the multilayer printed wiring board may be further suppressed.

In printed wiring board (40*b*) of the Third Embodiment, stiffener (42) is also used as a power-source conductor or a ground conductor. In doing so, the electrical features of the printed wiring board may be enhanced.

Others

So far, multilayer printed wiring boards according to the present embodiments have been described. However, those wiring boards are simply examples; the present invention is not limited to such. Additions, deletions, modifications, improvements and so forth, which a person skilled in the art may easily carry out, may be included in the scope of the present invention.

Accordingly, the technical scope of the present invention is determined by the description of the scope of the patent claims attached herein.

Obviously, numerous modifications and variations of the present invention are possible in light of the above teachings. It is therefore to be understood that within the scope of the appended claims, the invention may be practiced otherwise than as specifically described herein.

The invention claimed is:

1. A multilayer printed wiring board, comprising:
a plurality of resin insulation layers including an outermost resin insulation layer;
a plurality of pads configured to mount an electronic component and being formed in a pad-forming region on the outermost resin insulation layer;
a stiffener formed in a stiffener region on the outermost resin insulation layer;
an inner-layer resin insulation layer formed underneath the outermost resin insulation layer;
an inner-layer conductive circuit formed on the inner-layer resin insulation layer; and
a via conductor formed in the outermost resin insulation layer and connecting one of the plurality of pads to the inner-layer conductive circuit, wherein the upper surface of the stiffener and the upper surfaces of the pads are positioned at substantially the same level, wherein the total area of an upper-surface of the stiffener is substantially the same as the total area obtained by adding together an area of an upper surface of each of the plurality of pads.

2. The multilayer printed wiring board according to claim 1, wherein the stiffener is formed with an opening, and the plurality of pads are formed inside the opening of the stiffener.

3. The multilayer printed wiring board according to claim 2, wherein the opening is formed in a center of the stiffener.

4. The multilayer printed wiring board according to claim 1, wherein the stiffener and the plurality of pads are made of a same material.

5. The multilayer printed wiring board according to claim 1, wherein the stiffener and the plurality of pads are made of a same copper foil.

6. The multilayer printed wiring board according to claim 5, wherein the cut-out sections of the stiffener are formed to be symmetrical with respect to an axis which crosses the center of the outermost resin insulation layer and which is perpendicular to a surface of the outermost resin insulation layer.

7. The multilayer printed wiring board according to claim 1, wherein the stiffener comprises a plurality of cut-out sections.

8. The multilayer printed wiring board according to claim 1, wherein the total area of an upper-surface of the stiffener is set to be in the range of 70-130% of the total area obtained by adding together an area of an upper surface of each of the plurality pads.

9. The multilayer printed wiring board according to claim 1, wherein the stiffener is a power-source layer or a ground layer.

10. The multilayer printed wiring board according to claim 1, further comprising external terminals formed on a surface opposite to a surface where the pads and the stiffener are formed, wherein the pads are conductive circuits for mounting an IC chip, and the external terminals are conductive circuits for connection with other substrates.

11. The multilayer printed wiring board according to claim 1, wherein the plurality of resin insulation layers of the multilayer printed wiring board is four or more, and each resin insulation layer is formed with resin and inorganic particles.

12. The multilayer printed wiring board according to claim 11, wherein each resin insulation layer does not contain core material.

13. The multilayer printed wiring board according to claim 12, wherein each resin insulation layer does not contain core material made with fiber.

14. The multilayer printed wiring board according to claim 1, wherein the plurality of resin insulation layers of the multilayer printed wiring board is two or three, at least one resin insulation layer is formed with resin and core material.

15. The multilayer printed wiring board according to claim 14, wherein the plurality of resin insulation layers, other than the resin insulation layer made with resin and core material, are made with resin and inorganic particles.

16. A method for manufacturing a printed wiring board, comprising:
adhering or bonding a metal foil to a support plate, the surface of the support plate being made of a metal;
forming a resin insulation layer on the metal foil;
forming an opening portion in the resin insulation layer for a via conductor;
forming a conductive circuit on the resin insulation layer;
forming a via conductor in the opening portion, the via conductor connecting the metal foil and the conductive circuit;
separating the support plate from the metal foil; and
forming a plurality of pads for mounting a semiconductor chip in a first region and a stiffener in a second region from the metal foil, wherein the adhesion or bonding is an ultrasonic bond.

17. The method for manufacturing a printed wiring board according to claim 16, wherein at least one cut-out section is formed in the stiffener at the same time that the stiffener is formed from the metal foil.

18. The method for manufacturing a printed wiring board according to claim 16, further comprising forming the plurality of pads in a central region and forming the stiffener in a region surrounding the plurality pads.

19. A multilayer printed wiring board, comprising:

a plurality of resin insulation layers including an outermost resin insulation layer;

a plurality of pads configured to mount an electronic component and being formed in a pad-forming region on the outermost resin insulation layer;

a stiffener formed in a stiffener region on the outermost resin insulation layer;

an inner-layer resin insulation layer formed underneath the outermost resin insulation layer;

an inner-layer conductive circuit formed on the inner-layer resin insulation layer; and a via conductor formed in the outermost resin insulation layer and connecting one of the plurality of pads to the inner-layer conductive circuit, wherein the upper surface of the stiffener and the upper surfaces of the pads are positioned at substantially the same level, the plurality of resin insulation layers of the multilayer printed wiring board is two or three, and at least one resin insulation layer is formed with resin and core material.

20. The multilayer printed wiring board according to claim 19, wherein the plurality of resin insulation layers, other than the resin insulation layer made with resin and core material, are made with resin and inorganic particles.

* * * * *